United States Patent [19]

Sukamto et al.

[11] Patent Number: 5,218,357
[45] Date of Patent: Jun. 8, 1993

[54] MINIATURE MODULAR MICROWAVE END-TO-END RECEIVER

[75] Inventors: Lin M. C. Sukamto, Pasadena, Calif.; Thomas W. Cooley, Tucson, Ariz.; Michael A. Janssen, Pacific Palisades; Gary S. Parks, La Crescenta, both of Calif.

[73] Assignee: The United States of America as represented by the Administrator of the National Aeronautics and Space Administration, Washington, D.C.

[21] Appl. No.: 802,078

[22] Filed: Dec. 3, 1991

[51] Int. Cl.$^5$ .............. G01S 3/02; H05K 5/00; H01L 23/02
[52] U.S. Cl. ............... 342/351; 343/700 MS File; 361/394; 257/712
[58] Field of Search ............... 342/351; 357/80, 81; 361/381, 386, 389, 380, 391–395, 417–419; 343/700 MS File

[56] References Cited

U.S. PATENT DOCUMENTS

| Re. 32,369 | 3/1987 | Stockton et al. | 342/368 |
| 4,129,897 | 12/1978 | Telewski et al. | 361/399 |
| 5,045,503 | 9/1991 | Kobiki et al. | 437/228 |
| 5,049,978 | 9/1991 | Bates et al. | 357/80 |
| 5,065,124 | 11/1991 | Chrzan | 361/393 |
| 5,109,594 | 5/1992 | Sharp et al. | 357/80 |
| 5,113,315 | 5/1992 | Capp et al. | 361/386 |

OTHER PUBLICATIONS

Troup, "A New Method for Plating on Molybdenum", *Plating and Finishing*, Jan., 1991, pp. 69–71.
P. Bauhahn et al., "GHz Monolithic Balanced Mixers Using an Ion-Implanted FET-Compatible 3-Inch GaAs Wafer Process Technology," Proceedings of the *IEE Symposium on Microwave Theory and Techniques*, 1986 (CH2326-7), pp. 45–49.

Primary Examiner—Gregory C. Issing
Attorney, Agent, or Firm—John H. Kusmiss; Thomas H. Jones; Guy M. Miller

[57] ABSTRACT

An end-to-end microwave receiver system contained in a single miniature hybrid package mounted on a single heatsink, including an input end connected to a microwave receiver antenna and an output end which produces a digital count proportional to the amplitude of a signal of a selected microwave frequency band received at the antenna and corresponding to one of the water vapor absorption lines near frequencies of 20 GHz or 30 GHz. The hybrid package is on the order of several centimeters in length and a few centimeters in height and width. The package includes an L-shaped carrier having a base surface and a vertical wall extending up from the base surface and forming a corner therewith, external connection pins extending through the vertical wall. Modular blocks rest on the base surface against the vertical wall and support microwave monolithic integrated circuits on top surfaces thereof connected to the external connection pins. The modular blocks lie end-to-end on the base surface so as to be modularly removable by sliding along the base surface beneath the external connection pins away from the vertical wall.

23 Claims, 10 Drawing Sheets

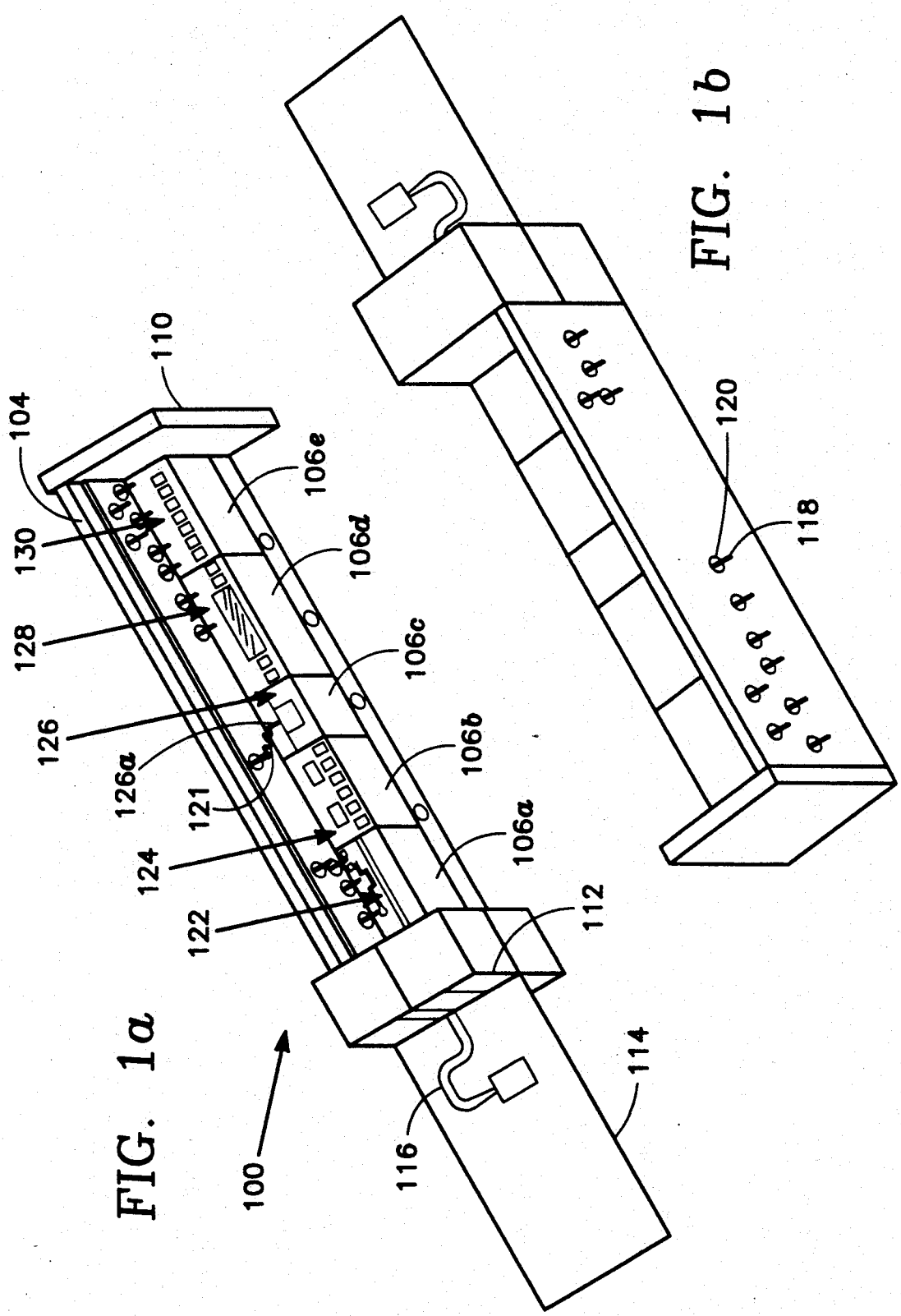

MINIATURE MODULAR MICROWAVE END-TO-END RECEIVER

Origin of the Invention

The invention described herein was made in the performance of work under a NASA contract, and is subject to the provisions of Public Law 96-517 (35 USC 202) in which the Contractor has elected not to retain title.

BACKGROUND OF THE INVENTION

1. Technical Field

The invention relates to microwave radiometry, and in particular to an end-to-end microwave receiver, such as a water vapor radiometer, formed of monolithic microwave integrated circuits on a single miniature integrated hybrid package system.

2. Background Art

Microwave components used in communication and radiometry typically consist of microwave circuits, microwave resonators and the like connected by microwave waveguides, resembling a plumbing maze. A complete end-to-end system, such as a microwave water vapor radiometer, includes a receiver antenna at the input end, all of the required frequency down-conversion circuitry and an analog-to-digital function at the output end. The amount of hardware required occupies a volume typically on the order of an average suitcase. Due to their large size, such systems are susceptible to errors due to temperature fluctuations in different parts of the system, although the analog-to-digital function at the output end produces a digital output signal which is impervious to temperature fluctuations. Due to their large weight, such systems are not readily transportable and are subject to breakdown due to vibration. Moreover, the cost of materials and the cost of manufacturing such systems is relatively high due to their type and size.

A more serious problem concerns microwave radiometry of extremely small signals requiring exceptional instrument sensitivity. For example, microwave radiometry was used to establish the uniformity of background radiation throughout space attributed to residual noise from the primordial "big bang", and is currently used to sense the background radiation at the water absorption lines around 20 GHz and 30 GHz to measure atmospheric moisture concentration in studies relating to aircraft wing ice formation and global warming. In all such cases, the radiation levels to be measured are extremely small. Temperature-induced fluctuations in the response characteristics of the microwave circuits in a microwave radiometer introduce performance limiting errors into any measurements which the radiometer makes. Such radiation is typically present in extremely small amounts, comparable in magnitude to fluctuations induced by small temperature variations in the microwave circuit elements of the radiometer. Accordingly, great attention is given to improving techniques for maintaining constant uniform temperature throughout the relatively large assembly of microwave components comprising the radiometer. Of course, the difficulty of maintaining a constant uniform temperature is proportional to the size of the radiometer. As a result, there has always been a fundamental limitation in the accuracy with which such devices could measure microwave radiation. This fundamental limitation arises from noise in the microwave circuit components attributable to small internal temperature fluctuations which are unavoidable in the typical bulky microwave radiometer.

Microwave systems such as radiometers are bulky in part because they consist of many hybrid circuits connected together. Each hybrid circuit consists of several integrated circuits or discrete components mounted in a single package. The waveguide hardware required to interconnect all of the hybrid circuits in the system is of considerable bulk. Heretofore, it has been feasible to implement only a limited function in each hybrid circuit. For example, a given hybrid circuit may be a mixer, or an amplifier or a local oscillator. Many such hybrid circuits are required to make a complete microwave system such as a microwave radiometer.

There is a trade-off in increasing the number of functions or circuits in a single hybrid package. On the one hand, it is less costly to manufacture a given set of functions or circuits if they are all contained in a single hybrid package, instead of being broken out into separate hybrid packages which must be interconnected. On the other hand, diagnosis and modular replacement of individual functions within the set which have failed is practical only if the functions are in separate packages. If all functions are contained in a single hybrid package, the failure of one function or component therein renders the entire device useless unless costly disassembly efforts are made. The system becomes less modular as more functions are implemented on a single hybrid circuit, a significant tradeoff. Such a tradeoff has seemed unavoidable in the prior art.

Moreover, increasing the capability of a single hybrid circuit requires that more integrated circuits or discrete components be connected together in a single hybrid circuit package. This in turn dramatically increases the difficulty and cost of manufacturing. During manufacture, the lid of the circuit package is removed and all soldering of connections or wire bonding must be done within the space contained within the four side walls of the circuit package. The limitations of working space and poor access impose practical constraints on the number of integrated circuits or components that can be included in a single hybrid circuit.

It is an object of the invention to radically reduce the size of an entire microwave device, such as a microwave radiometer, so as to greatly improve the tendency of a heat sink to maintain a virtually constant uniform temperature throughout the device.

It is a related object of the invention to provide an entire microwave device, such as a microwave radiometer, on a single miniature hybrid microwave circuit substrate supporting many monolithic microwave integrated circuits.

It is another object of the invention to provide a miniature hybrid microwave circuit substrate with easy three-dimensional access to all wire connections.

It is a still further object of the invention to provide a miniature hybrid microwave circuit substrate in which modular sections thereof may be removed without interference from other connected devices or protruding connector pins.

DISCLOSURE OF THE INVENTION

The invention is an end-to-end microwave receiver system, such as a microwave radiometer, in a single miniature hybrid package on the order of only several centimeters in length and only a few centimeters in height and width having an antenna at its input end and producing a temperature-independent signal (such as a digital signal) at its output end. All temperature-sensitive components of the system are contained within the one hybrid package, thereby facilitating uniform temperature control of the entire system by mounting the package on a heat sink. The package includes a carrier which is an L-shaped conductor with several modularly removable blocks nested end-to-end in the crook of the L. An L-shaped lid mounts edge-wise to the L-shaped conductor, and two rectangular end pieces seal the interior at each end of the L-shaped conductor, completing the package. The lid and the two end pieces are conductive materials. The entire assembly is mounted on a relatively heat sink, to maintain a virtually constant and uniform temperature throughout, so as to minimize or eliminate thermally induced noise.

Each modularly removable block has integrated circuits or monolithic microwave integrated circuits (such as gallium arsenide integrated circuits) mounted thereon in hybrid fashion, each block being a sub-system of the entire system. The modularly removable blocks rest on the horizontal base forming one branch of the L-shaped carrier while a vertical wall forming the other branch of the L-shaped carrier extends upward to a height significantly above the tops of the modularly removable blocks. Connecting pins for all the integrated circuits on the modularly removable blocks extend through the vertical wall and overlie the integrated circuits for ready access from three orthogonal directions. Bonded wires connect these pins to bonding pads on the integrated circuits mounted on the underlying modularly removable blocks. Each modular block is removable from the package without interference from any of the overlying pins by sliding it in the plane of the horizontal base of the carrier.

In one embodiment, the microwave system or device is a miniature microwave water vapor radiometer tuned to frequencies in the neighborhood of one of the water absorption lines near 20 GHz or 30 GHz. The package is gold-plated brass with the exception of the modularly removable blocks, which are gold-plated Molybdenum, to provide a thermal coefficient of expansion compatible with the gallium arsenide integrated circuits mounted thereon. At the input end of the package, a first modularly removable block supports a first hybrid circuit having a feedthrough conductor connected to an antenna port and a calibration noise source coupled to the feedthrough conductor. The next modularly removable block supports a second hybrid circuit of a low noise amplifier section, whose input is connected to the feedthrough conductor of the first hybrid circuit. The output of the amplifier section is connected to one input port of a mixer circuit mounted on the next modularly removable block. A local oscillator connects to another input port of the mixer through one of the pins in the vertical wall of the L-shaped carrier. An output port of the mixer is connected to the input of an amplifier/bandpass filter hybrid circuit mounted on the next modularly removable block. The output of the amplifier/bandpass filter is connected to a voltage-to-frequency converter hybrid circuit mounted on the last modularly removable block at the output end of the package.

The integrated circuits included in the hybrid circuits mounted on respective modular blocks have bonding pads which must be connected to bias voltage sources. Such connections are made through the vertical wall via bonding wires connected to respective ones of the pins in the vertical wall.

The use of an L-shaped substrate makes practical the mounting and connection of many integrated circuits in a single hybrid package by providing unlimited access thereto along three orthogonal directions. The use of modularly removable blocks maintains the advantages of modular assembly and repair while including all of the circuits or components of an end-to-end microwave receiver system such as a radiometer in a single miniature hybrid package with an antenna at the input end of the package, all of the temperature-sensitive circuits being mounted in the same package and producing a temperature-impervious signal at the output end of the package (such as a digital signal). These features have therefore made possible the first miniature microwave water vapor radiometer formed in a single hybrid package.

BRIEF DESCRIPTION OF THE DRAWINGS

FIG.'S 1a and 1b are different perspective views of a carrier of a hybrid package embodying the invention.

FIG. 2b is a schematic block diagram of the assembly of FIG. 2a.

FIG. 3b is a schematic block diagram hybrid circuit of FIG. 3a.

FIG. 4b is a schematic block diagram of the hybrid circuit of FIG. 4a.

FIG. 5b is a schematic block diagram of the hybrid circuit of FIG. 5a.

FIG. 6b is a schematic block diagram of the hybrid circuit of FIG. 6a.

MODES FOR CARRYING OUT THE INVENTION

Figure 1C:
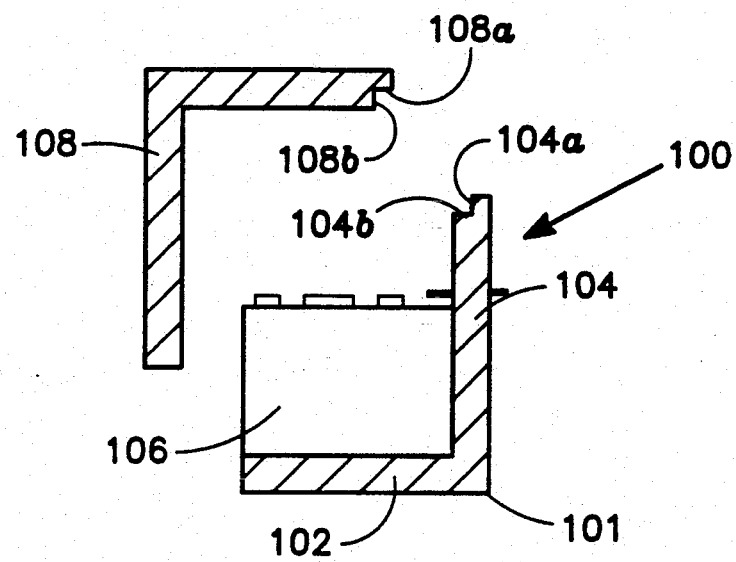
FIG. 1c is an end view of the hybrid package of FIG'S. 1a and 1b.
Figure 3B:
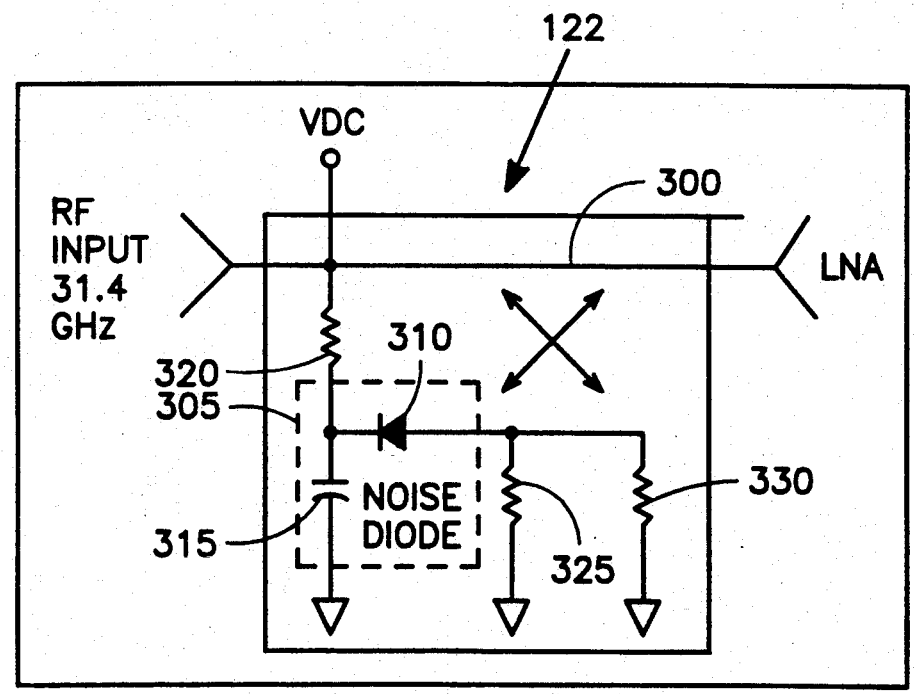

Referring to FIG.'S 1a, 1b and 1c, the microwave system embodying the invention (in this example a microwave water vapor radiometer) is contained within a single miniature hybrid package 100 consisting of an L-shaped carrier 100 having a horizontal base 102 and a vertical wall 104 and a series of modular blocks 106 nested in the crook or corner formed between the base 102 and wall 104 of the L-shaped carrier 101. The package 100 further includes an L-shaped lid 108 and a pair of ends 110, 112 which together with the lid 108 are fastened on the carrier 101 to seal the volume containing the modular blocks. Preferably, corner lip surfaces 104a, 104b on one longitudinal edge of the vertical wall 104 and corner lip surfaces 108a, 108b on a corresponding longitudinal edge of the lid 108 nest within one another when the lid 108 is mounted on the carrier 101 and fastened with screws (not shown). A microwave receiving antenna 114 including an antenna conductor pattern 116 is mounted at the front end 112. External connections (from bias voltage supplies, for example) to circuit elements mounted on the modular blocks 106 are provided by conductive pins 118 extending through holes 120 in the vertical L branch 104 and protruding out over the modular blocks 106. These pins are connected to bonding pads on the circuits mounted on the blocks 106 via bonding wires 121 as shown in FIG. 1a.

A noise source circuit 122 is mounted on the first modular block 106a. A low noise amplifier circuit 124 is mounted on the second modular block 106b. A mixer circuit 126 is mounted on the third modular block 106c. An IF amplifier circuit 128 is mounted on the fourth modular block 106d. A voltage-to-frequency converter 130 circuit is mounted on the last modular block 106e.

Referring to FIG.'S 2a and 2b, the package 100 is mounted on a heat sink 200 along with a microwave dielectric resonator oscillator 202 via a coaxial cable 204 and a standard K connecter in the vertical wall 104 to one input of the mixer circuit 126. The oscillator 202 is sold by Varian Associates under part number VSK-9614. As shown in FIG. 2b, the low noise amplifier circuit 124 includes two cascaded low noise amplifier monolithic microwave integrated circuits (MMIC's) 132, 134. The IF amplifier circuit includes three input cascaded IF amplifier MMIC's 136, 138, 139, an IF bandpass filter 140 and three cascaded output IF amplifiers 142, 144, 146.

The noise source 122 is used during operation to intermittently produce a noise signal of known power providing a standard power level from which the system output is calibrated. Referring to FIG.'S 3a and 3b, the noise source 122 is a hybrid microwave circuit formed on an alumina layer over the modular block 106a and consists of a feedthrough conductor 300 connected to the antenna conductor 116 and one input of the low noise amplifier circuit 124, a diode MMIC 305 having three Schottky barrier diodes 310 and a capacitor 315, a bias resistor 320, a resistor 325 and a termination resistor 330. The termination resistor 330 is in a conductive pattern 335 including a coupling section 340 near the main conductor 300 through which power from the noise diodes 305 couples to the input of the low noise amplifier circuit 124 and a quarterwave short-to-ground conductive pattern 345 which provides RF signal termination. The noise source diode MMIC 305 is preferably a NoiseCom MMIC part number NC404.

Figure 4A:
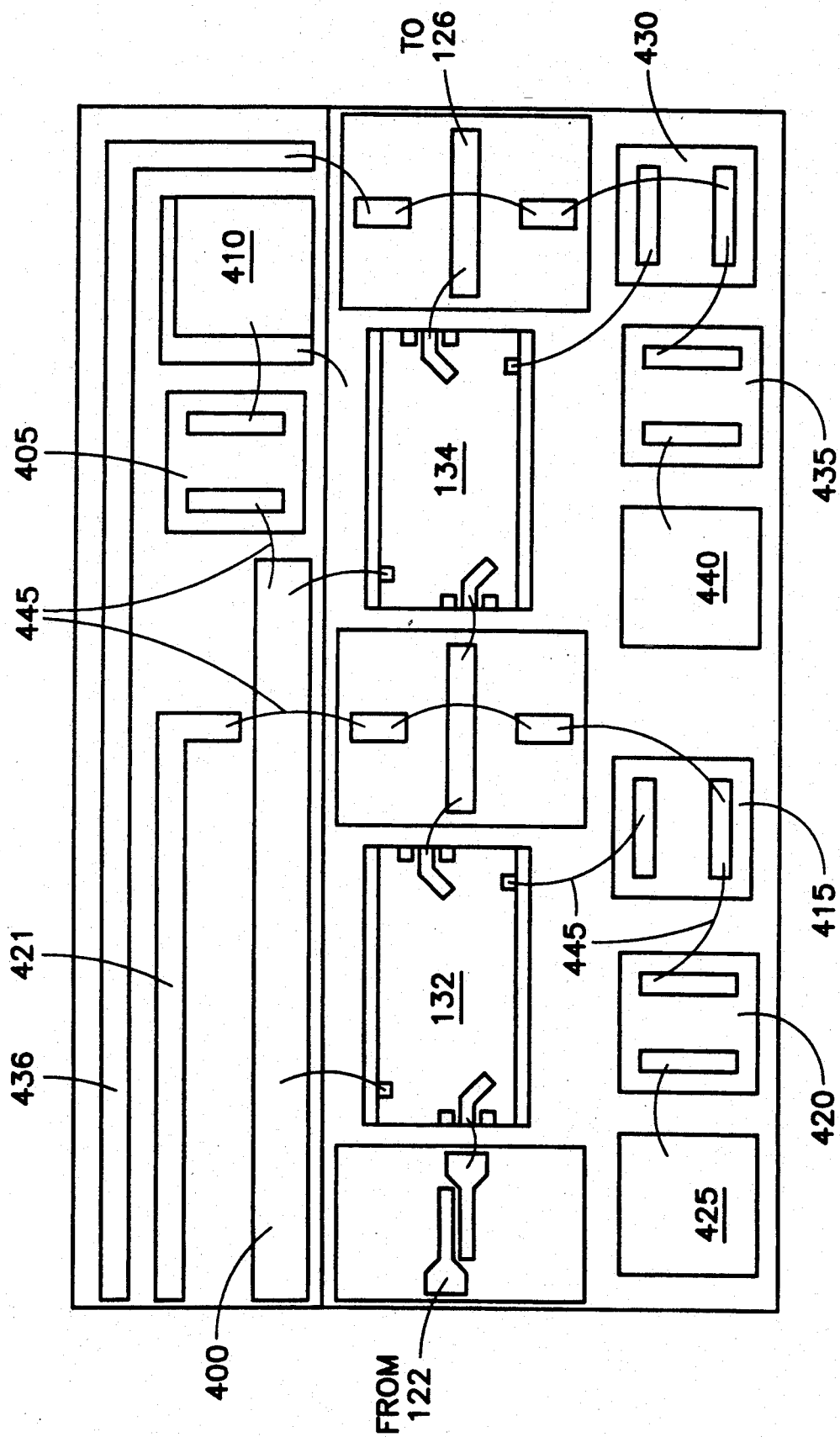
FIG. 4a is a plan view of a low noise amplifier hybrid circuit in the hybrid package of FIG.'S 1a and 1b.
Figure 4B:
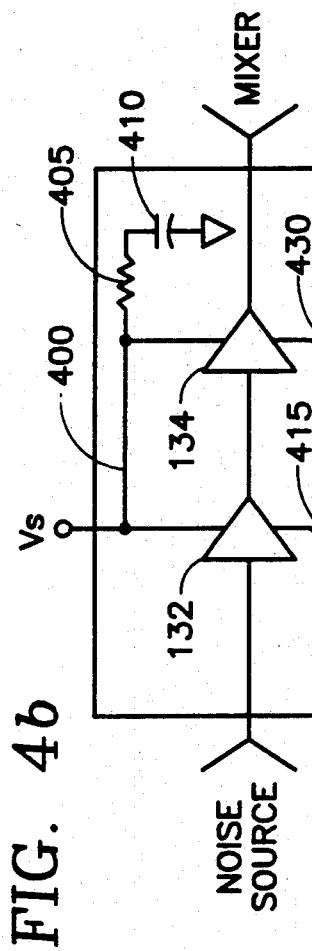
Figure 5A:
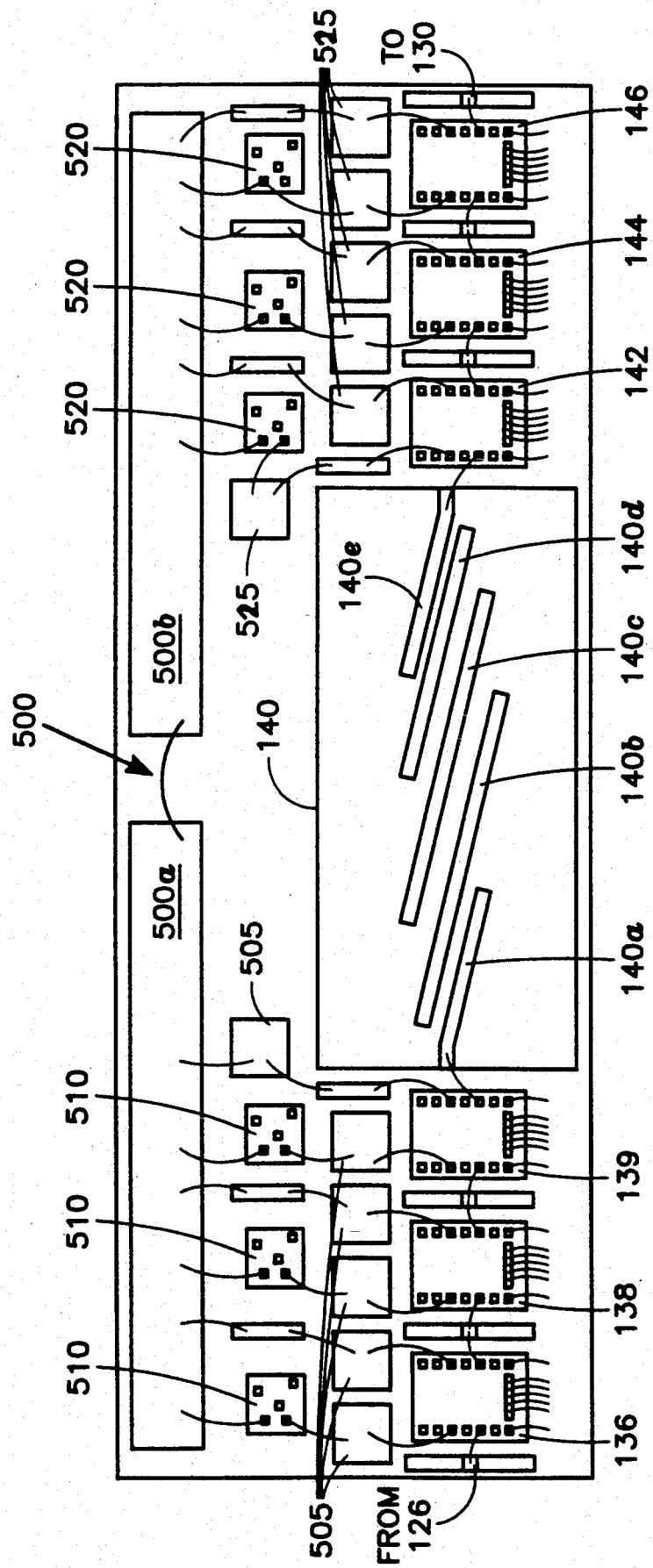
FIG. 5a is a plan view of an IF amplifier hybrid circuit in the hybrid package of FIG.'S 1a and 1b.
Figure 5B:
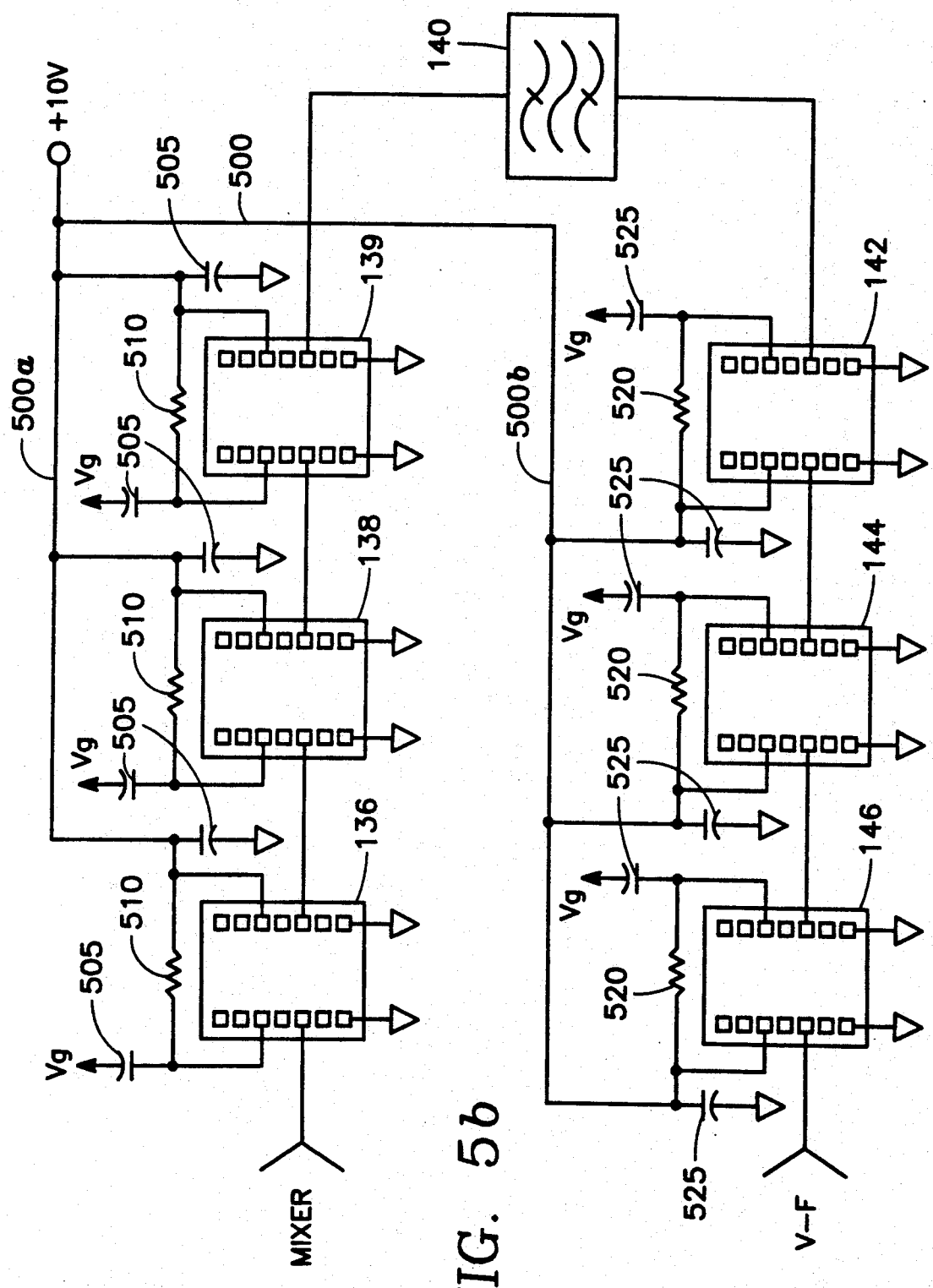

Referring to FIG.'S 4a and 4b, the low noise amplifier MMIC's 132, 134 are each a Varian Low Noise Amplifier MMIC part number VSM-9599H5. A first bias voltage supply conductive pattern 400 is connected to an external bias voltage supply via a bonding wire to one of the overlying pins 118, and is connected to a bias resistor 405 and capacitor 410. The low noise amplifier MMIC 132 is connected via a bias RC network 415, 420, 425 to a second bias voltage supply conductive pattern 421. The low noise amplifier MMIC 134 is connected via a bias RC network 430, 435, 440 to a third bias voltage supply conductive pattern 436. The conductive patterns 400, 421, 436 are formed on an alumina layer overlying the gold-plated modular block 106b, and each is connected by an individual bonding wire to a respective one of the pins 118. A bonding wire connects the input of the first amplifier MMIC 132 to the output end of the main conductor 300 of the noise source 122 (as indicated in FIG. 4a). Similarly, a bonding wire connects the output of the second amplifier MMIC 134 to one input of the mixer circuit 126 (as indicated in FIG. 4a). In a similar manner, each one of the hybrid circuits 122, 124, 126, 128, 130 is connected to the next one via a bonding wire.

The mixer circuit 126 is a microwave mixer MMIC procured from Honeywell Corporation, Honeywell Physical Sciences Center, 10701 Lyndale Avenue S., Bloomington, Minn. 55420 and described by Honeywell in P. Bauhahn, et al., "30 GHz Monolithic Balanced Mixers Using an Ion-Implanted FET-Compatible 3-Inch GaAs Wafer Process Technology," Proceedings of the IEEE Symposium on Microwave Theory and Techniques, 1986 (CH2326-7), pages 45-49. The mixer 126 has two input ports and an output port. One of the input ports is connected to the output of the low noise amplifier circuit 124 via a conductive pattern formed over an alumina layer on the modular block 106c. The other input port of the mixer circuit 126 is connected via a similar conductive pattern 126a connected by a bonded wire 121 to the K connector in the vertical wall 104 to the waveguide 204, as shown in FIG. 1a. The output port of the mixer circuit 126 is connected by another similar conductive pattern via a bonding wire to the input of the IF amplifier circuit 128.

Referring to FIG.'S 5a and 5b showing the IF amplifier hybrid circuit 128, each one of the three cascaded input IF amplifier MMIC's 136, 138, 139 and the three cascaded output IF amplifier MMIC's 142, 144, 146 is a Pacific Monolithic MMIC part number PM-AM1802. The bandpass filter circuit 140 is designed in accordance with standard techniques to have a center bandpass frequency of 9.4 GHz. A first bias voltage supply conductive pattern 500, including two sections 500a, 500b connected together by a bonding wire, are connected via a bonding wire to a respective one of the overlying external pins 118. The first conductive pattern section 500a is connected to bias voltage pads on the input IF amplifier MMIC's 136, 138, 139 via RC networks of bias capacitors 505 and resistors 510. Similarly, the second conductive pattern section 500b is connected to bias voltage pads on the output IF amplifer MMIC's 142, 144, 146 via RC networks of bias resistors 520 and capacitors 525.

Referring to FIG.'S 6a and 6b, the analog-to-digital converter circuit 130 includes an operational amplifier 600 which is an integrated circuit manufactured by Analog Devices, part number AD OP-27, a voltage to frequency converter 602 which is an Analog Devices voltage-to-frequency integrated circuit part number AD-567 and a detector diode part number 125 HFBD manufactured by Custom Components, Inc. The detector diode 604 is connected to the input of the operational amplifier IC 600 RC network resistors and capacitors 606, 608, 610. A negative bias voltage supply conductive pattern 618 formed on an alumina layer over the modular block 106e is connected to the negative supply bonding pad of the operational amplifier 600, while a positive bias voltage supply conductive pattern 620 is connected to the positive supply bonding pad of the operational amplifier 600. The signal input and output pads of the operational amplifier are connected via conductive pads 612, 614 on the alumina layer over the modular block 106e across an external variable gain resistor (indicated schematically only) accessed via a pair of the external pins 118 on the vertical wall 104. The variable resistor controls the gain of the operational amplifier 600. The gain of the operational amplifier 600 is set so that its output at least meets the threshold requirements of the voltage-to-frequency converter 602.

The output of the operational amplifier 600 is connected to the input of the voltage to frequency converter 602 through a resistor 622 across a Zener diode 624. A ground plane conductive pattern 626 formed over an alumina layer on the modular block 106e is connected to the ground potential of the modular block 106e and to three bonding pads of the voltage-to-frequency converter 602. A positive bias voltage supply conductive pattern 628 formed on the alumina layer is connected via a bonding wire to one of the overlying pins 118 on the vertical wall 104, to a first pad of the voltage-to-frequency converter 602 and through a resistor 630 to a second pad thereof. A capacitor 632 is connected across the two frequency-trimming pads of the voltage-to-frequency converter 602. An output conductive pattern 634 formed over the alumina layer on the modular block 106e is connected to output side of the resistor 630.

Figure 6B:
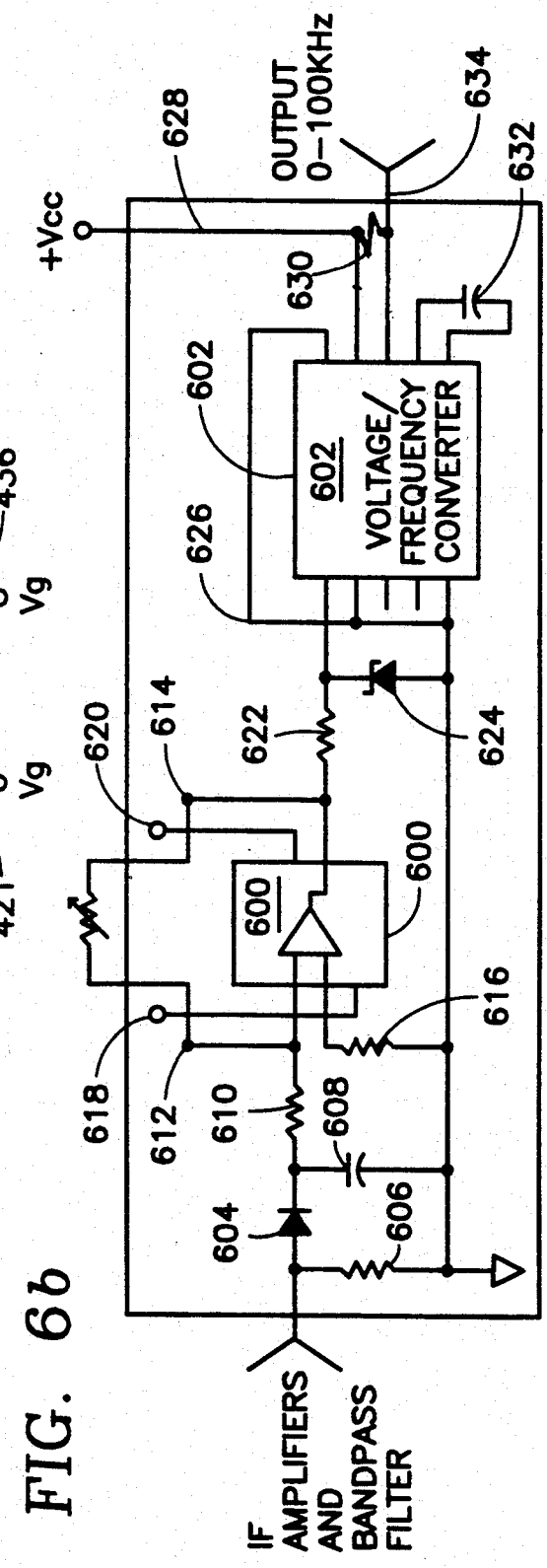
Figure 6A:
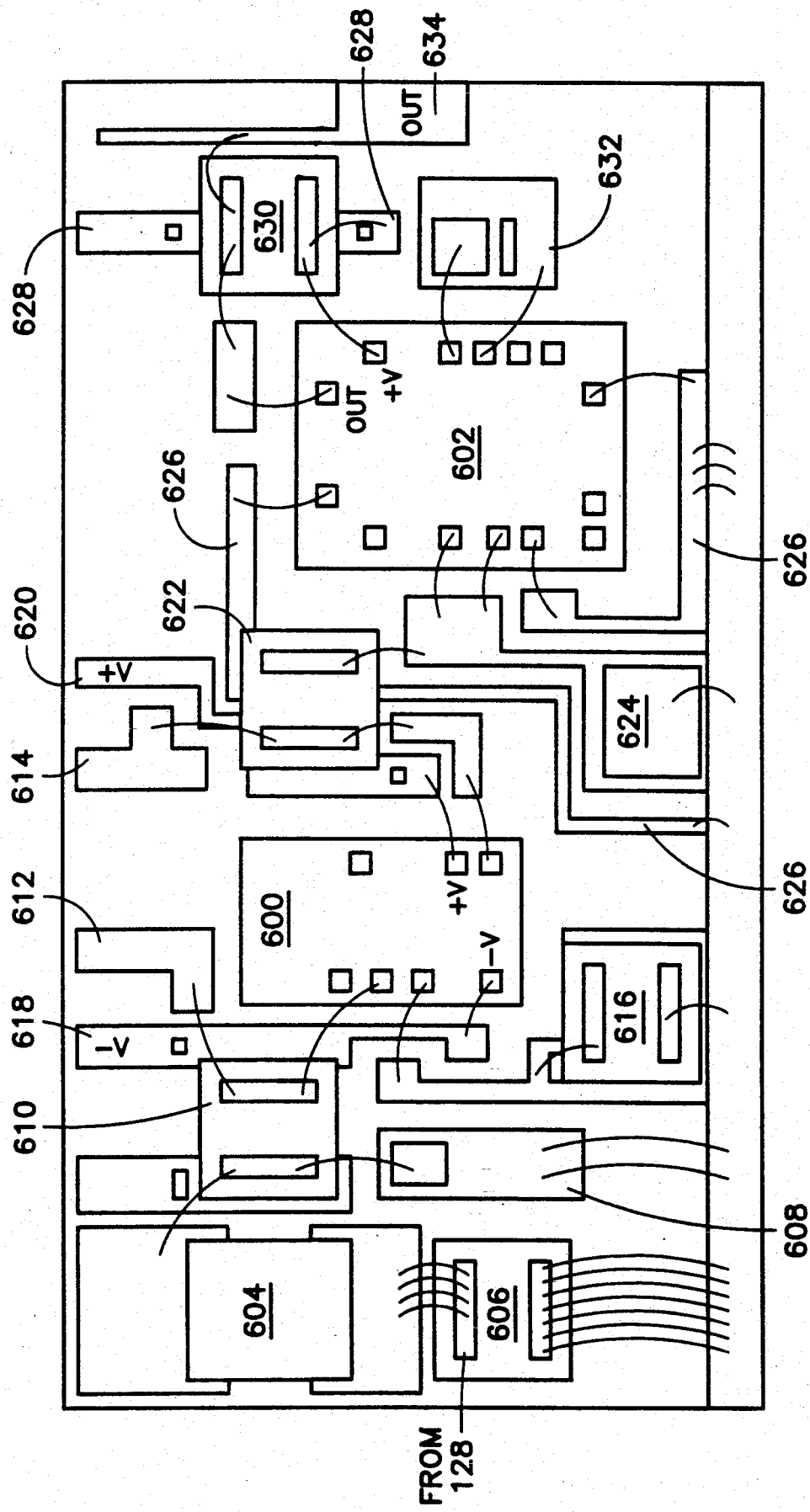
FIG. 6a is a plan view of an analog-to digital converter hybrid circuit in the hybrid package of FIG.'S 1a and 1b.

As indicated in FIG. 6a, the various conductive patterns formed on the alumina layer over the top surface of the modular block 106e are in a lower layer over which the various components such as the detector diode 604, the resistors 606, 610, 616, 622, 630 and the Zener diode 624 are formed in an upper layer. The upper layer is insulated from the lower layer except at locations where a connection therebetween is formed (such as the connection from the resistor 622 to the Zener diode 624). This two-layer architecture greatly reduces the size of the analog-to-digital converter 130 so that it may be included in the miniature hybrid package 100.

In operation, the noise source 122 is activated only when it is desired to calibrate the system by adjusting the variable gain control resistor connected to the operational amplifier 600 of the analog-to-digital converter function 130. Otherwise, the signal from the antenna conductive pattern 116 is passed directly along the feedthrough conductor 300 to the low noise amplifier circuit 124. Thereafter, it is mixed in the mixer circuit 126 with a 22 GHz reference signal from the local oscillator 202. The 31.4 GHz signal component received by the antenna conductive pattern 116 (associated with one absorption line of water vapor) and the local oscillator signal produce a 9.4 GHz difference component at the output of the mixer circuit 126. The IF bandpass filter 140 filters out all other components except the 9.4 GHz difference component, while the IF amplifiers 136, 138, 139, 142, 144, 146 amplify the 9.4 GHz difference component. The analog-to-digital converter function 130 produces a digital pulse train whose frequency is in the range of 1 to 100 KHz and is directly proportional to the amplitude of the 9.4 GHz component. The digital pulse train is sent to a counter (not shown in the drawings) at the output of the hybrid package 100 where it is converted to a digital count transmitted to external signal processing devices. Counting of the pulses in the pulse train is fairly immune to temperature fluctuations, so that all of the temperature-sensitive components of the system are contained within the single hybrid package 100.

Figure 2A:
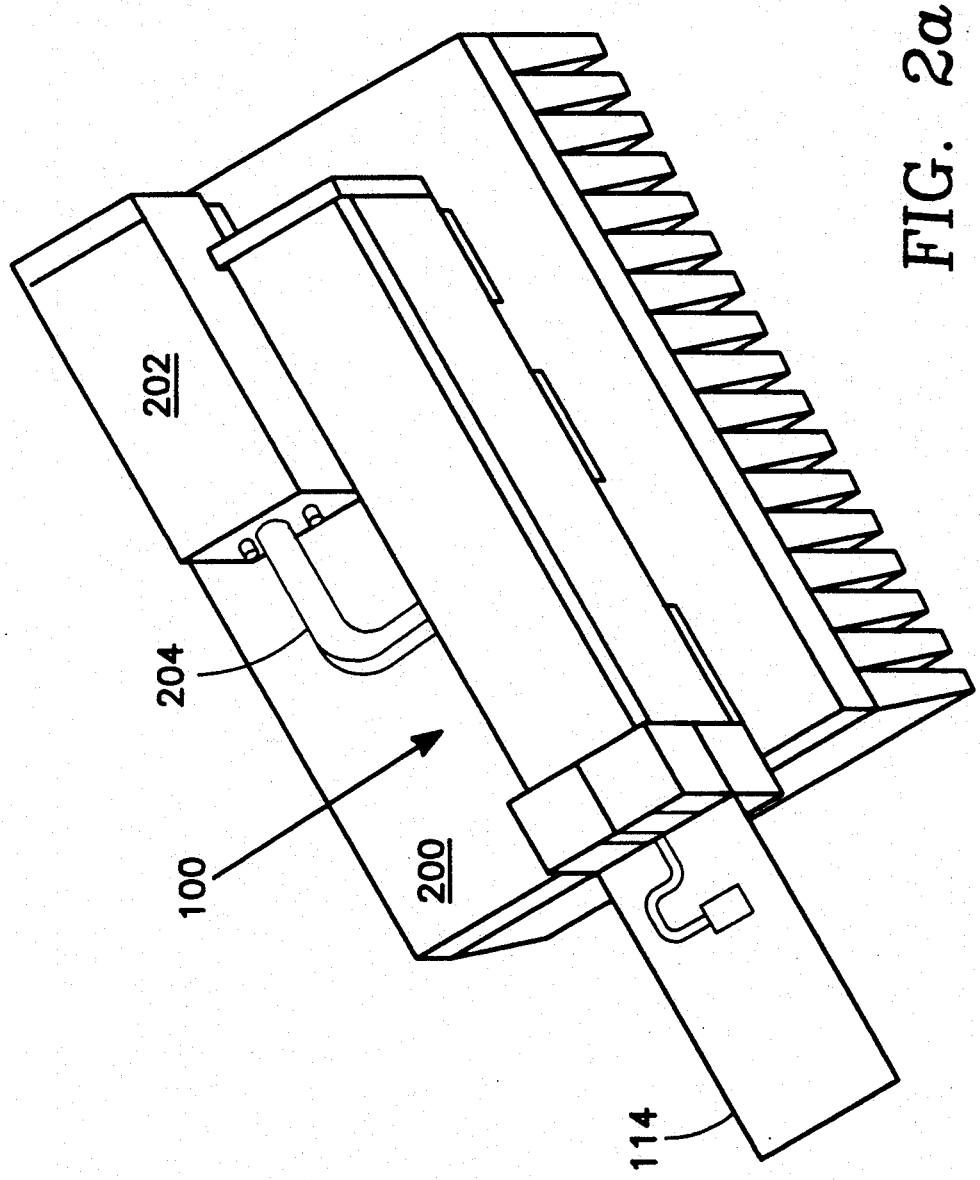
FIG. 2a is a perspective view of a microwave radiometer and heatsink assembly corresponding to FIG.'S 1a and 1b.
Figure 2B:
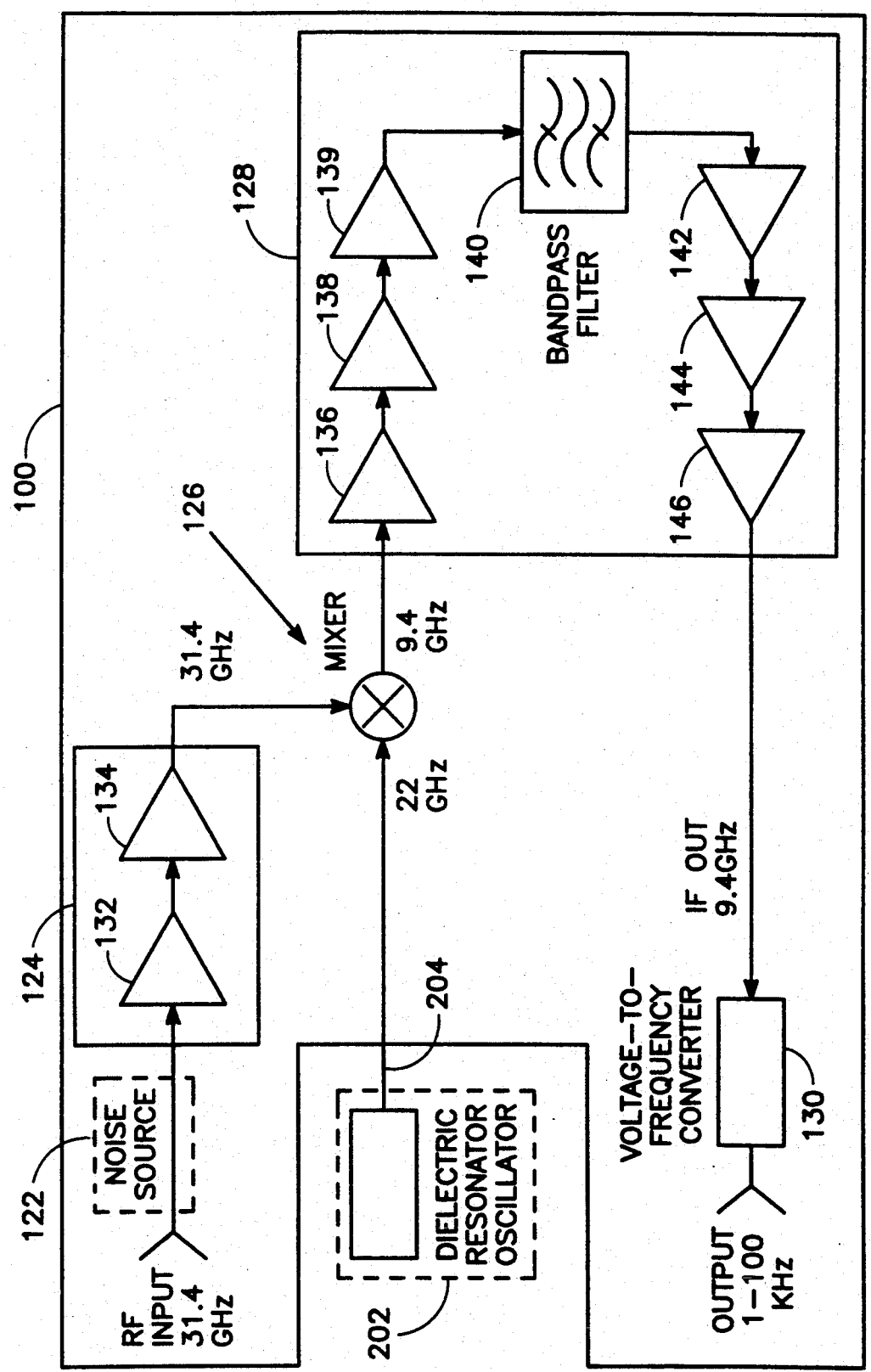
Figure 3A:
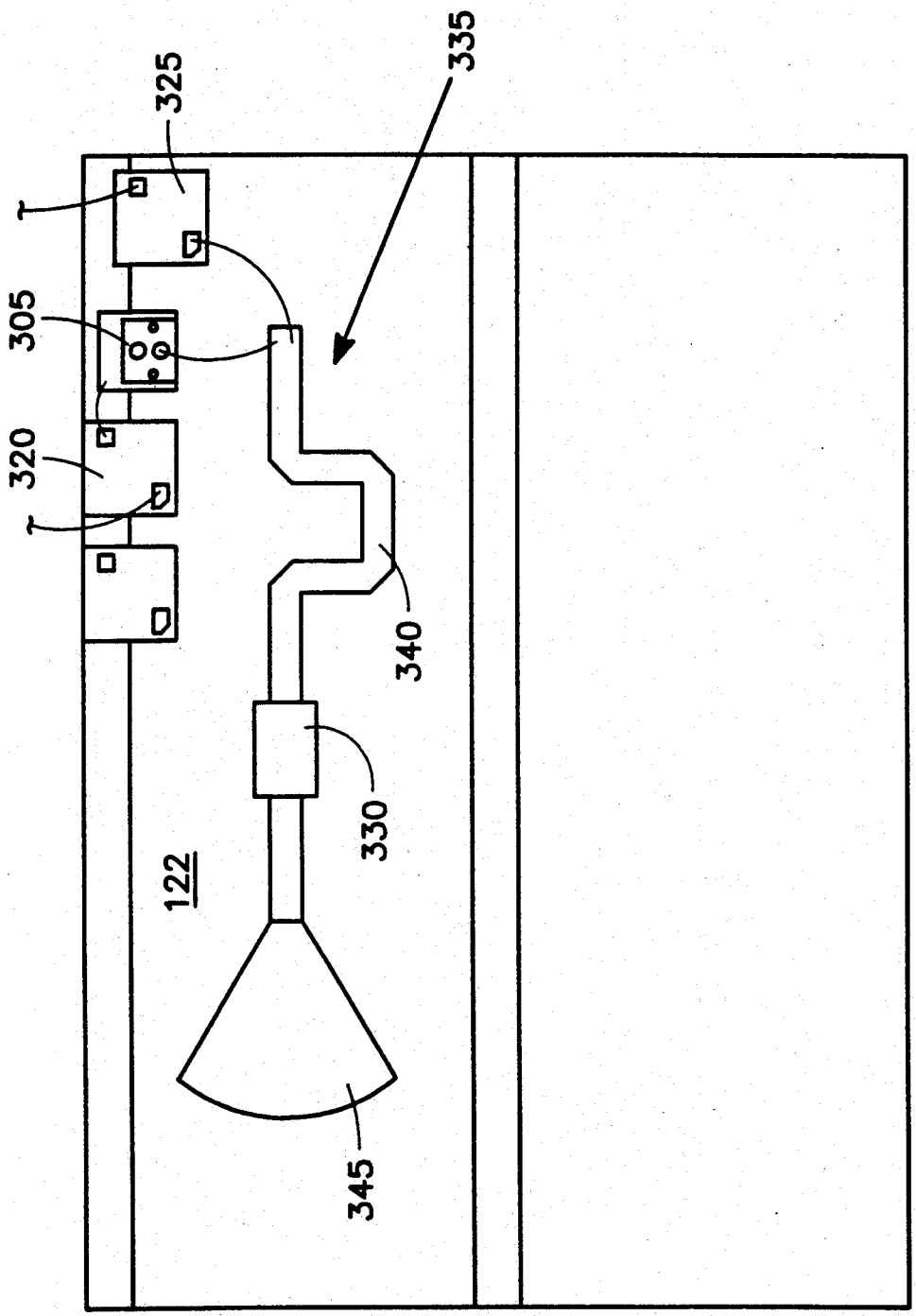
FIG. 3a is a plan view of a noise source hybrid circuit in the hybrid package of FIG.'S 1a and 1b.

It is contemplated that a complete water vapor measurement system is constructed from the invention by employing two microwave receiver systems of the type illustrated in FIG. 2a, one tuned to a first water vapor absorption frequency near 20 GHz and the other tuned to a second water vapor absorption frequency near 31.4 GHz, and a processor determines the ambient water vapor concentration in a portion of the sky viewed by the antenna from the outputs of the two radiometers using well-known algorithms.

While the invention has been described with reference to a preferred embodiment wherein the MMIC's are placed on an alumina layer formed over a gold-plated Molybdenum modular block 106, selected ones of the MMIC's are preferably placed directly on the gold-plated modular block. Specifically the two low noise amplifier MMIC's 132, 134 are placed directly on the gold-plated top surface of the modular block 106b and the six IF amplifier MMIC's 136, 138, 139, 142, 144, 146 are placed directly on the gold-plated surface of the modular block 106d. The Molybdenum blocks 106 are gold-plated using a process described by Troup, "A New Method for Plating Molybdenum," Plating and Surface Finishing, January 1991, pages 69-71.

Table I provides exemplary component values in each of the hybrid circuits described above.

TABLE I

| circuit | resistor | resistance | capacitor | capacitance |
|---|---|---|---|---|
| 122 | 330 | 50 ohms | | |
| | 325 | 800 ohms | | |
| | 320 | 800 ohms | | |
| 124 | 405 | 20 ohms | 410 | 100 pf |
| | 420 | 20 ohms | 425 | 100 pf |
| | 435 | 20 ohms | 440 | 100 pf |
| | 415 | 5 ohms | | |
| | 430 | 5 ohms | | |
| 128 | 510 | 750 ohms | 505 | 100 pf |
| | 520 | 750 ohms | 525 | 100 pf |
| 130 | 606 | 50 ohms | 608 | 1000 pf |
| | 610 | 10,000 ohms | 632 | 1000 pf |
| | 616 | 10,000 ohms | | |
| | 622 | 10,000 ohms | | |
| | 630 | 10,000 ohms | | |

While the invention has been described in detail by specific reference to preferred embodiments thereof, it is understood that variations and modifications thereof may be made without departing from the true spirit and scope of the invention.

What is claimed is:

1. An end-to-end microwave receiver system contained in a single miniature hybrid package, including an input end connected to a microwave receiver antenna and an output end which produces a digital count proportional to the amplitude of a signal of a selected microwave frequency band received at said antenna.

2. The microwave receiver system of claim 1 further comprising a heatsink covering a bottom surface of said hybrid package.

3. The microwave receiver system of claim 2 further comprising a local oscillator outside of said hybrid package and mounted on said heat sink and having an output connected to circuit elements within said hybrid package.

4. The microwave receiver system of claim 1 wherein said selected frequency corresponds to one of the water vapor absorption lines near frequencies of 20 GHz or 30 GHz, said receiver comprising a water vapor radiometer.

5. The microwave receiver system of claim 1 wherein said hybrid package comprises:
   an L-shaped carrier having a base surface and a vertical wall extending up from said base surface and forming a corner therewith;
   a plurality of external connection pins extending through said vertical wall and having interior ends overlying said base surface and connectable to circuit elements contained in said hybrid package and exterior ends protruding from an exterior surface of said vertical wall for connection to elements external of said hybrid package.

6. The microwave receiver system of claim 5 further comprising:
a plurality of modular blocks resting on said base surface against said vertical wall, said modular blocks capable of supporting microwave circuit elements on top surfaces thereof, whereby said interior ends of said external connection pins are connectable to said circuit elements.

7. The microwave receiver system of claim 6 wherein said blocks lie end-to-end on said base surface so as to be modularly removable by sliding along said base surface beneath said external connection pins away from said vertical wall.

8. The microwave receiver system of claim 7 further comprising microwave monolithic integrated circuits (MMIC's) mounted over top surfaces of ones of said modular blocks, resistor and capacitor elements mounted over said top surfaces of said modular blocks, and bonding wires connecting bonding pads of said MMIC's to ones of said external connection pins and said resistor and capacitor elements.

9. The microwave receiver system of claim 8 further comprising an L-shaped lid fastenable over said L-shaped carrier and a pair of ends fastenable to respective ends of said carrier, whereby said carrier, lid and pair of ends seal a space containing said modular blocks.

10. The microwave receiver system of claim 7 further comprising:
a calibration noise source hybrid circuit mounted on a first one of said modular blocks at said input end and including a feed through conductor connectable to said antenna;
a low noise amplifier hybrid circuit mounted on a second one of said modular blocks having its input connected to an output end of said feed through conductor;
a mixer circuit on a third one of said modular blocks connected to an output of said low noise amplifier circuit and to an output of an external local oscillator;
an IF bandpass amplifier hybrid circuit with its input connected to an output of said mixer and mounted on a fourth one of said modular blocks and tuned to a difference frequency between a microwave frequency of interest to which said antenna is tuned and the frequency of said local oscillator; and
an analog-to-digital conversion circuit mounted on a fifth one of said modular blocks and having an input connected to an output of said IF bandpass amplifier hybrid circuit.

11. The microwave receiver of claim 1 wherein said hybrid package comprises a plurality of modular blocks, said modular blocks capable of supporting microwave circuit elements on top surfaces thereof.

12. The microwave receiver system of claim 10 further comprising microwave monolithic integrated circuits (MMIC's) mounted over top surfaces of ones of said modular blocks, resistor and capacitor elements mounted over said top surfaces of said modular blocks, and bonding wires connecting bonding pads of said MMIC's to ones of resistor and capacitor elements and to external connection pins of said hybrid package.

13. The microwave receiver of claim 11 further comprising:
an L-shaped carrier having a base surface and a vertical wall extending up from said base surface and forming a corner therewith, said plurality of modular blocks resting on said base surface against said vertical wall;
a plurality of external connection pins extending through said vertical wall and having interior ends overlying said modular blocks and connectable to circuit elements on said modular blocks and exterior ends protruding from an exterior surface of said vertical wall for connection to elements external of said hybrid package.

14. The microwave receiver system of claim 13 wherein said blocks lie end-to-end on said base surface so as to be modularly removable by sliding along said base surface beneath said external connection pins away from said vertical wall.

15. The microwave receiver system of claim 13 wherein said modular blocks each comprise a gold-plated metal such as Molybdenum, having a thermal coefficient of expansion compatible with said microwave circuit elements, and said carrier, lid and ends each comprise gold-plated brass.

16. A microwave hybrid package system comprising:
an L-shaped carrier having a base surface and a vertical wall extending up from said base surface and forming a corner therewith;
a plurality of external connection pins extending through said vertical wall and having interior ends overlying said base surface and connectable to circuit elements contained in said hybrid package and exterior ends protruding from an exterior surface of said vertical wall for connection to elements external of said hybrid package.

17. The microwave hybrid package system of claim 16 further comprising:
a plurality of modular blocks resting on said base surface against said vertical wall, said modular blocks capable of supporting microwave circuit elements on top surfaces thereof, whereby said interior ends of said external connection pins are connectable to said circuit elements.

18. The microwave hybrid package system of claim 17 wherein said blocks lie end-to-end on said base surface so as to be modularly removable by sliding along said base surface beneath said external connection pins away from said vertical wall.

19. The microwave hybrid package system of claim 18 further comprising microwave monolithic integrated circuits (MMIC's) mounted on top surfaces of ones of said modular blocks, resistor and capacitor elements mounted over said top surfaces of said modular blocks, and bonding wires connecting bonding pads of said MMIC's to ones of said external connection pins and said resistor and capacitor elements.

20. A microwave hybrid package comprising a plurality of modular blocks contained within said package, said modular blocks capable of supporting microwave circuit elements on top surfaces thereof, where microwave monolithis integrated circuits (MMIC's) are mounted on top surfaces of ones of said modular blocks, resistor and capacitor elements mounted on said top surfaces of said modular blocks, and bonding wires connecting bonding pads of said MMIC's to ones of resistor and capacitor elements and to external connection pins of said hybrid package, and further comprising:
an L-shaped carrier having a base surface and a vertical wall extending up from said base surface and forming a corner therewith, said plurality of modular blocks resting on said base surface against said vertical wall;

a plurality of external connection pins extending through said vertical wall and having interior ends overlying said modular blocks and connectable to circuit elements contained in said hybrid package and exterior ends protruding from an exterior surface of said vertical wall for connection to elements external of said hybrid package.

21. The microwave hybrid package of claim 20 wherein said blocks lie end-to-end on said base surface so as to be modularly removable by sliding along said base surface beneath said external connection pins away from said vertical wall.

22. The microwave hybrid package of claim 21 further comprising an L-shaped lid fastenable over said L-shaped carrier and a pair of ends fastenable to respective ends of said carrier, whereby said carrier, lid and pair of ends seal a space containing said modular blocks.

23. The microwave hybrid package of claim 20 wherein said modular blocks comprise a metal such as Molybdenum having a thermal coefficient of expansion compatible with Gallium Arsenide MMIC's and having a surface gold plated in such a manner as to be susceptible of soldering bonding wires on said surface without destroying said gold plating.

* * * * *